United States Patent
Cheng

(10) Patent No.: US 6,740,820 B2
(45) Date of Patent: May 25, 2004

(54) HEAT DISTRIBUTOR FOR ELECTRICAL CONNECTOR

(76) Inventor: Andrew Cheng, 22928 Estoril Dr., #5, Diamond Bar, CA (US) 91765

( * ) Notice: Subject to any disclaimer, the term of this patent is extended or adjusted under 35 U.S.C. 154(b) by 0 days.

(21) Appl. No.: 10/020,287

(22) Filed: Dec. 11, 2001

(65) Prior Publication Data

US 2003/0106710 A1 Jun. 12, 2003

(51) Int. Cl.[7] .................................................. H05K 1/16
(52) U.S. Cl. ...................... 174/260; 174/261; 174/251; 361/704; 439/876
(58) Field of Search .................. 174/261, 252, 174/163; 362/702, 703, 704, 714; 439/83, 876, 495; 115/80.3, 185; 257/722

Primary Examiner—Kamand Cuneo
Assistant Examiner—I B Patel

(57) ABSTRACT

An electrical system includes a printed circuit board with conductive traces formed thereon. An electrical connector includes an insulative base with an array of cells defined therein. Each cell receives and retains a conductive contact having a tail portion corresponding to the conductive traces. Soldering pre-forms are arranged between the conductive traces and the tail portions. A heat distributor includes a thermally conductive base plate positioned on the connector base and thermally conductive pins extending from the base plate. The base plate is positioned on the connector base with the pins inserted into the cells and thermally engaging selected contacts so as to create a homogenous heat transfer to/from the soldering pre-forms thereby eliminating heat stress among the soldering pre-forms

7 Claims, 8 Drawing Sheets

HEAT DISTRIBUTOR FOR ELECTRICAL CONNECTOR

BACKGROUND OF THE INVENTION

1. Field of the Invention

The present invention relates to a heat distributor to be selectively mounted to a solder ball based electrical connector for uniform distribution of heat to the solder balls of the connector.

2. The Related Arts

An electrical connector generally comprises an insulation housing retaining a number of contacts. An electrical connector is electrically mounted to a printed circuit board by connecting tails of the contacts to corresponding conductive traces formed on the printed circuit board. Attaching an electrical connector to a printed circuit board by means of soldering is widely known in the electronic and computer industry. One of the problems encountered by the industry is heat distribution to the contact tails of the connector and conductive traces of the printed circuit board. In some soldering technologies, such as SMT (Surface Mount Technology), solder paste is applied to the conductive traces in advance. The solder paste must be simultaneously and homogeneously melted and solidified during the SMT process in order to avoid residual stress caused by heat difference between the tails and the conductive traces. The heat stress may create cracks between the tails and the conductive traces, resulting in poor quality of soldering.

In certain types of connectors, such as a DIMM (Dual In-Line Memory Module) socket connector, the tails of the connector are formed in two parallel rows extending along opposite sides of the connector housing. Since the tails are arranged along the sides of the connector housing, heat can be substantially uniformly applied to the tails and thus the heat stress problem is not severe.

However, when a connector has a great number of contacts, such as a BGA (Ball Grid Array) socket connector for use with a CPU (Central Processing Unit) module, wherein the tails of the contacts are arranged in a rectangular matrix or array, the problem described above becomes severe.

As shown in FIGS. 1–4 of the attached drawings, a typical BGA socket, generally designated with reference numeral 100, includes a great number of conductive contacts arranged in an array. An example of the BGA socket comprises 603 contacts. The BGA socket 100 includes a base 110 and a cover 120 moveably carried by the base 110. The cover 120 can carry and support a CPU module (not shown) thereon. The cover 120 defines a number of holes 121, such as 603 holes, in aligning with cells 111 defined in the base 110. Each cell 111 receives and retains a contact 112 including a tail portion 112a carrying a solder ball 130 extending beyond a bottom surface 110a of the base 110. Each contact 112 has an engaging portion 112b for electrical engagement with a pin leg of the CPU module.

As it can be readily appreciated from the drawings, when the BGA socket 100 is placed on a printed circuit board 150, there is a small gap between the bottom surface 110a and the printed circuit board 150. The solder balls 130 are melted through a re-flowing process in which heat source of infra red is imposed to the solder balls 130 so as to melt them down simultaneously.

As clearly seen from the drawings, the base 110 is a rectangular member and the solder balls 130 are arranged in a rectangular matrix. It can be easily understood that the solder balls 130 located adjacent to the outer edges of the base 110 can be quickly heated by the infrared wave through convention. However, the solder balls 130 that are located far from the edges will be comparatively difficult to be heated.

In the typical example, the BGA socket 100 is provided with an opening 113 which allows heat to be effectively transfer to the inner solder balls 130. This, however, does not completely solve the problem. In addition, some of the BGA sockets, such as the so called mPGA 478 socket connector used in notebook computers, are not provided with such an opening 113.

In addition, some of the BGA sockets may even have more than one thousand (1000) contacts/solder balls. Uniformly heating the solder balls, and simultaneously cool them down together so as to prevent a heat difference is really a critical and challenging issue to be addressed.

After the BGA socket is soldered to a circuit board through an SMT process, it is difficult to neatly remove the socket from the circuit board because it is hardly to get all the solder balls melted simultaneously and evenly for separating the connector contacts from the circuit board. This is because of the same reason of non-uniform heat distribution discussed above.

In current practice, the BGA socket connector is attached to a circuit board by an SMT process with the aid of infrared heating. The infrared wave creates a heat flow within a chamber in which the BGA socket is carried by a conveyor. The temperature within the chamber increases gradually till a certain point such that the solder balls melt to make soldering between the contact tails and the conductive pads/traces on the circuit board. Afterward, the BGA socket is cooled down.

From the above description, it can be appreciated that heat distribution, both in heating and cooling for the inner solder balls are an issue. Namely, the inner solder balls are difficult to be heated as well as cooled. A solution for evenly and simultaneously melting the solder balls is therefore required.

Most of the connectors are provided with a smooth surface which may be part of the connector itself or an additional part attached to the connector for handling the connector in a pick-and-place fashion by means of for example an industrial robot. In the BGA socket discussed above, an additional part, such as a plastic cap or tape, is attached to a top surface of the BGA socket for the pick-and-place operation. The use of the additional part increases costs of the connector.

SUMMARY OF THE INVENTION

Accordingly, an object of the present invention to provide a heat distributor for use with an electrical connector to uniformly transfer heat to/from solder tails of the connector during a soldering process.

Another object of the present invention to provide a heat distributor capable to uniformly transfer heat to all the solder tails of the connector and also serve as a pick-and-place plate for handling the connector.

In order to achieve the objects set forth, an electrical system in accordance with the present invention comprises a printed circuit board with conductive traces formed thereon. An electrical connector comprises a base with an array of cells defined therein. The cells receive and retain conductive contacts having tail portions corresponding to the conductive traces. Soldering pre-forms are arranged between the conductive traces and the tail portions and a heat distributor is attached to the connector. The heat distributor has a base plate having a large surface area and conductive pins extending from the base plate and thermally engaging some or all of the contacts for facilitating uniform heat transfer to/from the soldering pre-forms thereby eliminating heat stress among the soldering pre-forms caused during the heating process.

According to an aspect of the present invention, the base plate is selectively provided with openings so as to control heat exposed thereon.

According to another aspect of the present invention, the base plate comprises fins extending upward to collect/dissipate heat.

BRIEF DESCRIPTION OF THE DRAWINGS

The present invention will be apparent to those skilled in the art by reading the following description of preferred embodiments thereof, with reference to the attached drawings, in which:

FIG. 11 is a cross-sectional view of a heat distributor constructed in accordance with a fourth embodiment of the present invention.

DETAILED DESCRIPTION OF THE PREFERRED EMBODIMENT

Figure 5:
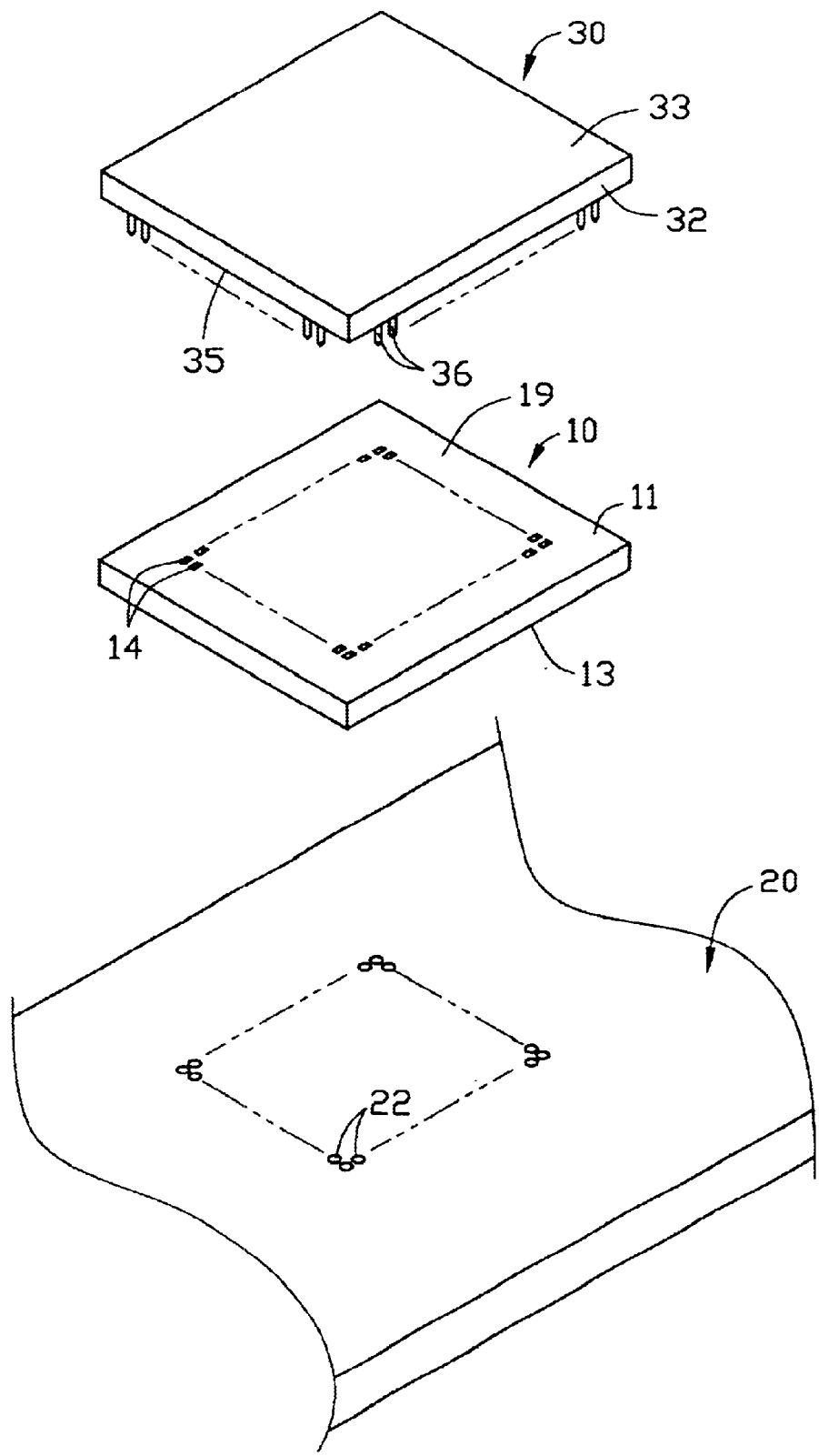
FIG. 5 is a perspective view of a heat distributor constructed in accordance with a first embodiment of the present invention to be mounted to an electrical connector soldered to a circuit board.
Figure 6:
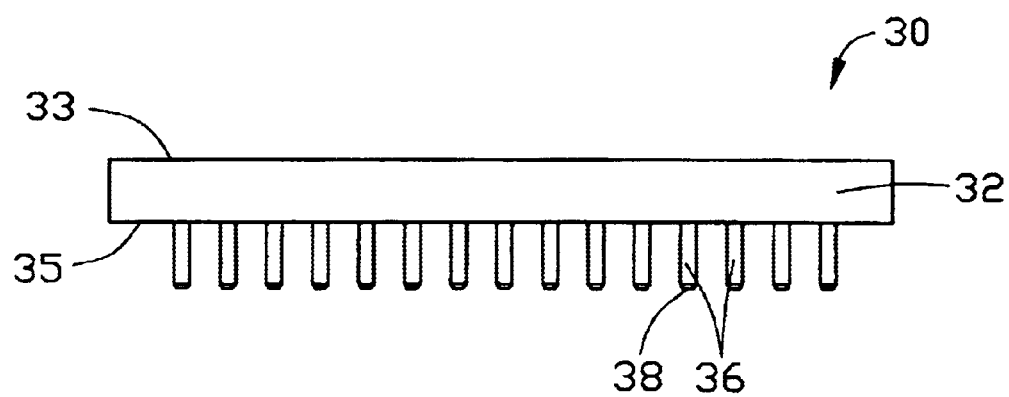
FIG. 6 is a side elevational view of the heat distributor in accordance with the present invention.

With reference to the drawings and in particular to FIGS. 5 and 6, a heat distributor constructed in accordance with a first embodiment of the present invention, generally designated with reference numeral 30, is to be mounted to an electrical connector 10 for uniform distribution of heat to tails of contacts of the connector 10. The heat distributor 30 comprises a base plate 32 having top and bottom faces 33, 35 of large surface area. A number of pins 36 extend from the bottom face 35. Preferably, each pin 36 has a chamfered or reduced free end 38.

Figure 1:
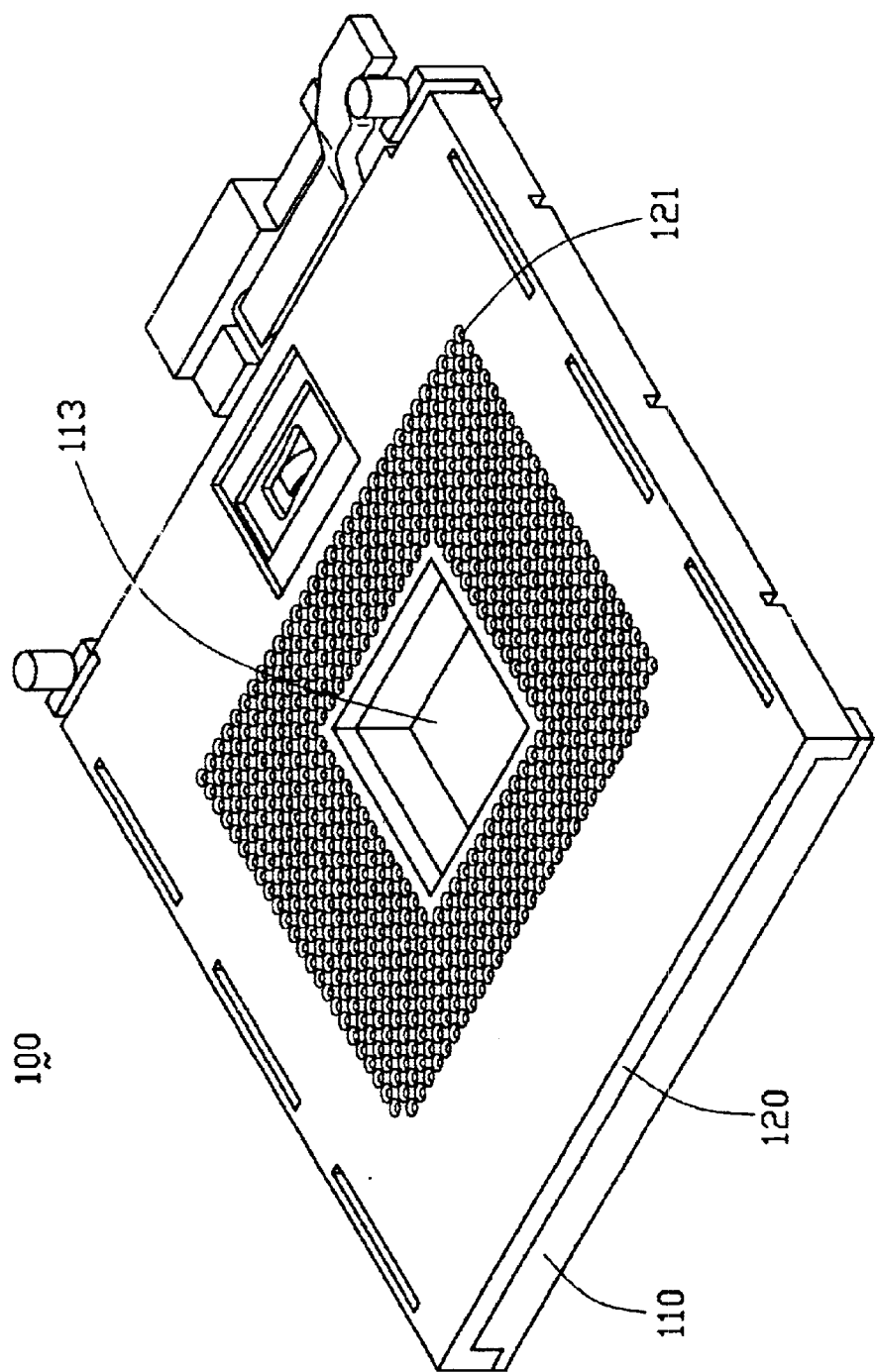
FIG. 1 is a perspective view of a typical BGA (Ball Grid Array) socket connector.
Figure 2:
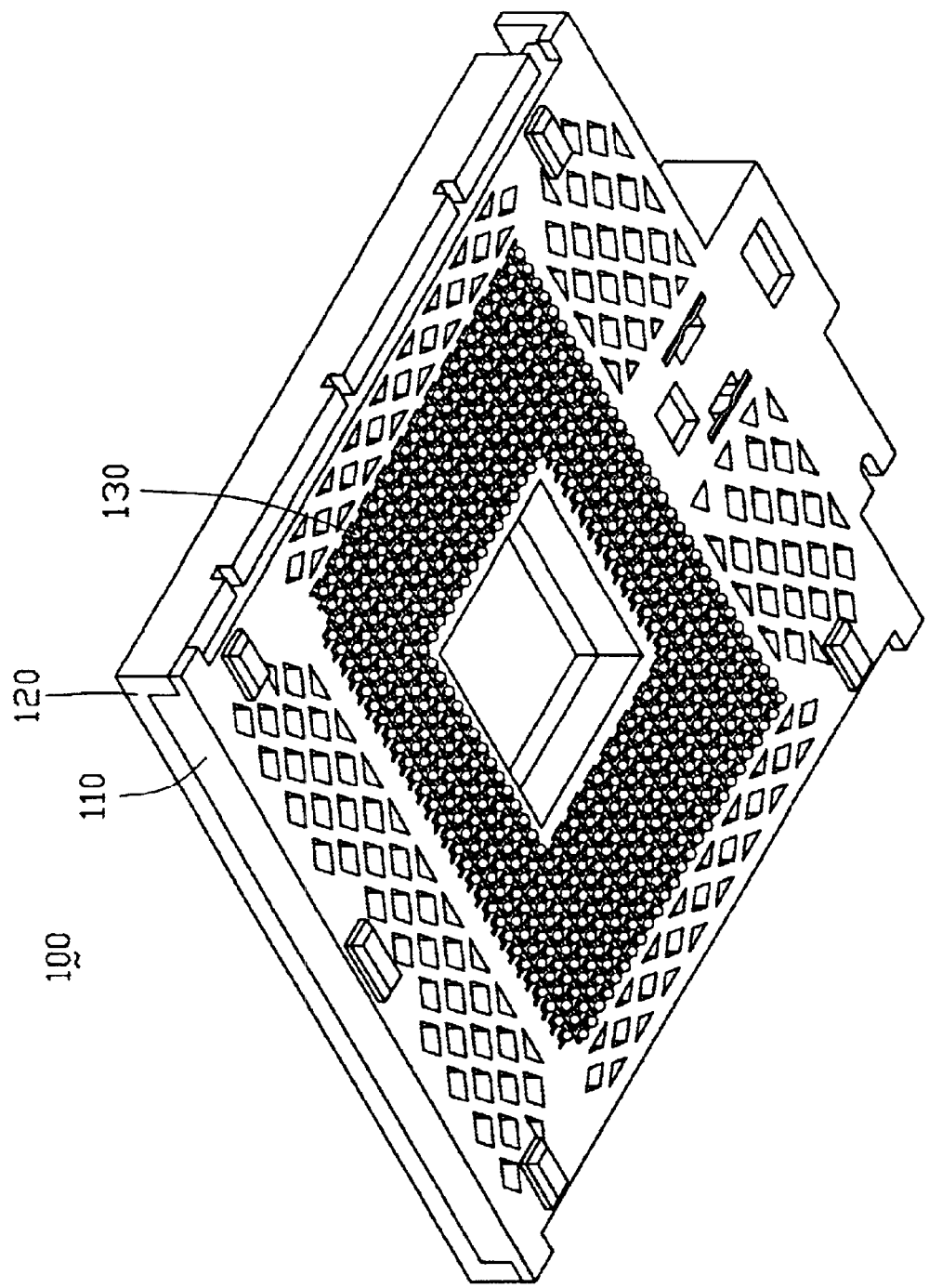
FIG. 2 is a bottom view of FIG. 1 showing solder balls attached thereto.
Figure 3:
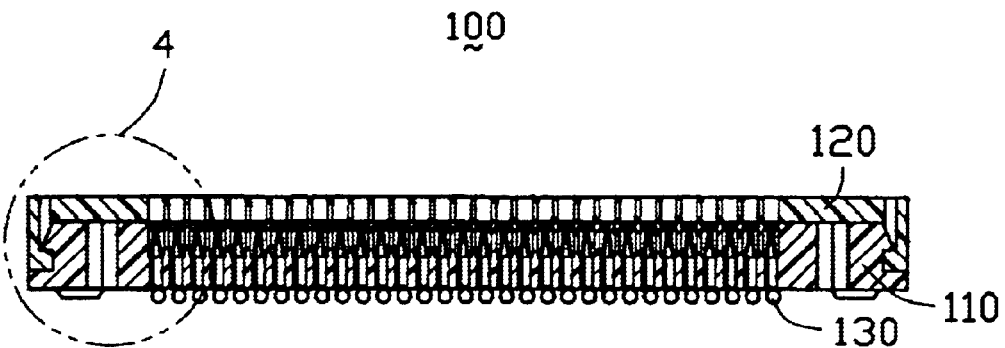
FIG. 3 is a cross-sectional view of the typical BGA socket shown in FIG. 1.
Figure 4:
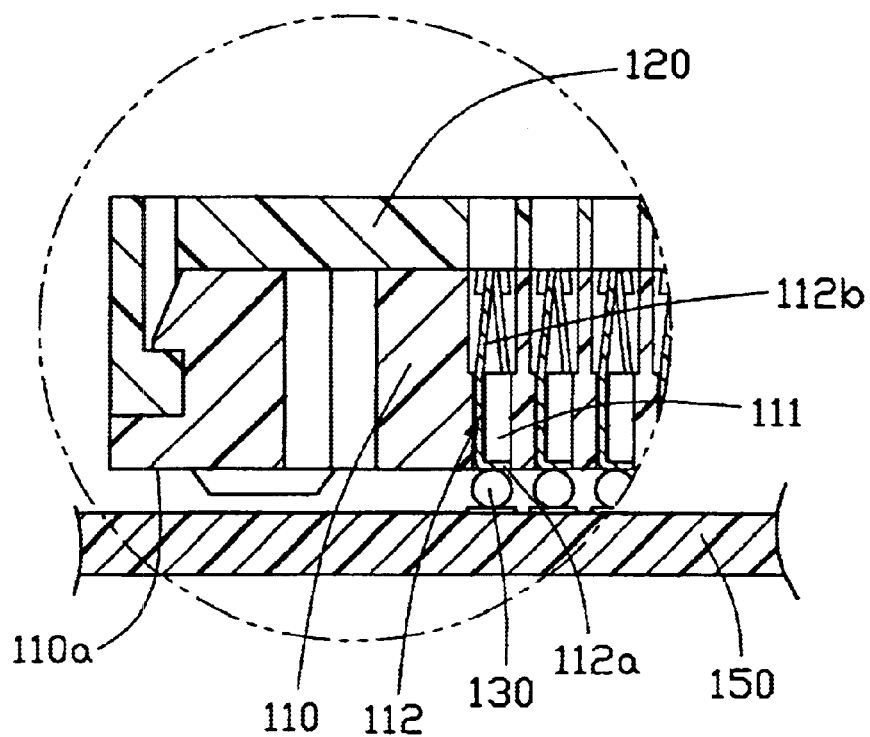
FIG. 4 is an enlarged view of the encircled portion 4 of FIG. 3, a portion of a circuit board being also shown to illustrate the spatial relationship therebetween.

The electrical connector 10 can be connectors of any type. A preferred example is the BGA (Ball Grid Array) socket connector shown in FIGS. 1 and 2. However, for illustrative purposes, the connector 10 in the embodiment illustrated has a simplified structure, comprising an insulation housing or base 19 with no movable cover attached thereto. It is apparent to those having ordinary skills to apply the principle of the present invention to the BGA socket connectors.

Figure 7:
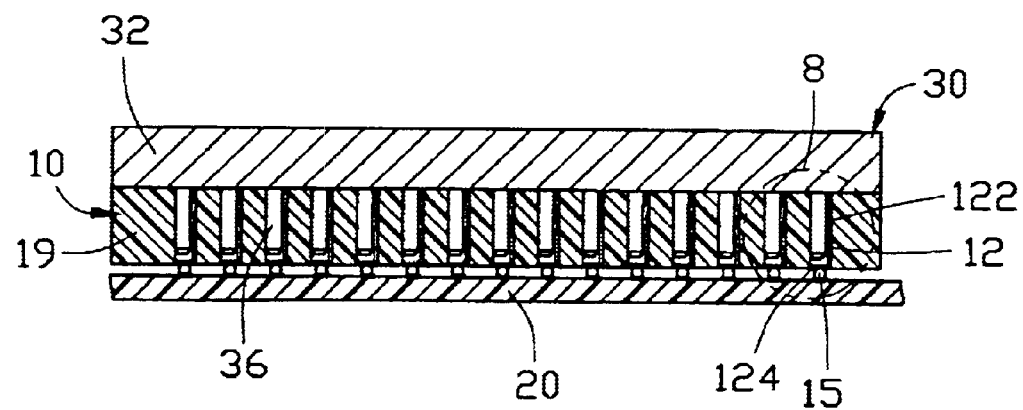
FIG. 7 is a cross-sectional view showing the heat distributor mounted to the connector.
Figure 8:
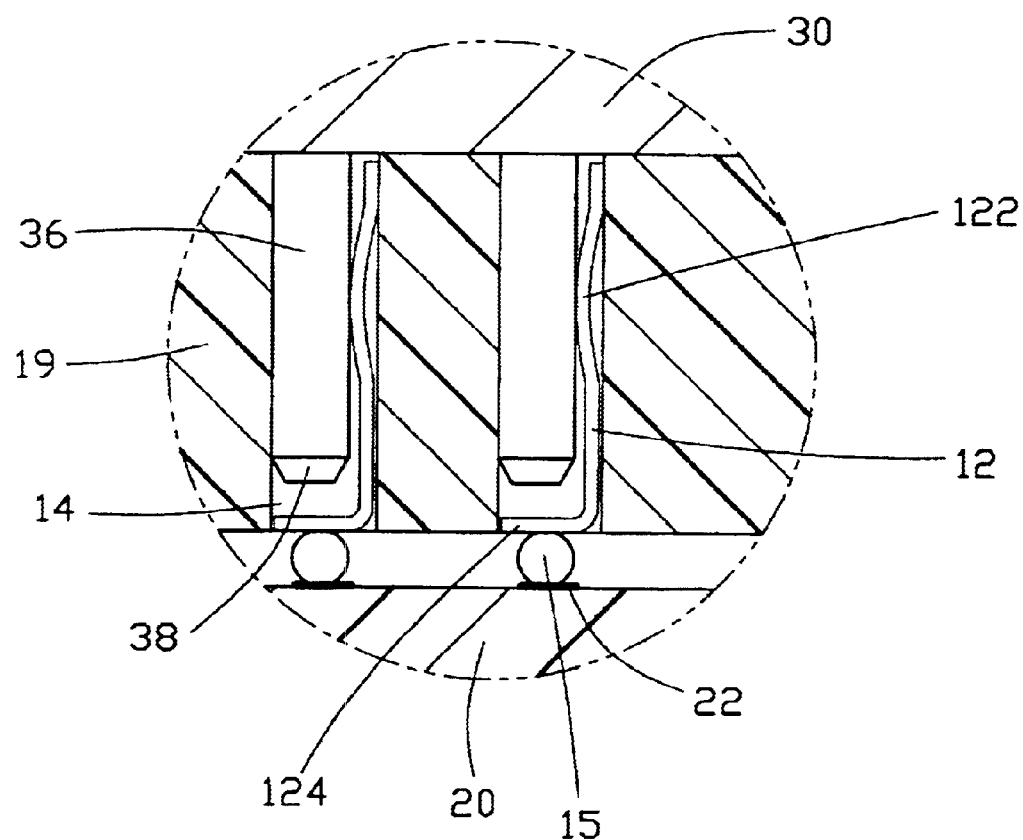
FIG. 8 is an enlarged view of the encircled portion 8 of FIG. 7.

Also referring to FIGS. 7 and 8, the housing 19 of the connector 10 has a bottom face 13 to be positioned on a circuit board 20 and an opposite top face 11 for supporting an electronic device, such as a central processing unit module (not shown) having a plurality of pin legs. A plurality of cells 14 is defined in the housing 19 and arranged in an array. Each cell 14 receives and retains a conductive contact 12 which has an engaging portion 122 and a soldering tail 124 carrying a solder ball 15. The connector 10 is placed on the circuit board 20 with the solder balls 15 seated on and engaging conductive traces or pads 22 formed on the circuit board 20. Each cell 14 is open to the top face 11 of the housing 19 for receiving a corresponding one of the pin legs of the electronic device for electrical connection of the electronic device to the circuit board 20.

To solder the connector 10 to the circuit board 20, a heating process is performed to melt the solder balls 15 and thus attach the solder balls 15 to the conductive traces 22 of the circuit board 20 after the solder balls 15 are cooled down again.

The pins 36 of the heat distributor 30 are arranged in a similar way as the pin legs of the electronic device whereby the heat distributor 30 can be mounted to the top face 11 of the housing 19 by having the pins 36 inserted into the corresponding cells 14 and engaging the corresponding contacts 12 of the connector 10. The reduced ends 38 of the pins 36 help insertion of the pins 36 into the corresponding cells 14 of the housing 19 of the connector 10.

The base plate 32 and the pins 36 of the heat distributor 30 are made of a thermal conductive material, such as metals or alloys, and the base plate 32 is made with large surface area for helping absorbing heat induced thereon by infrared wave. The thermal conduction of the base plate 32 allows the heat absorbed by the base plate 32 to be efficiently transferred to the pins 36 which under a physical engagement with the conductive contacts 12 of the connector 10 transfer the heat to the solder balls 15 via the contacts 12 of the connector 10 thereby facilitating uniform distribution of heat through the solder balls 15.

It is preferred that the material that makes the heat distributor 30 has a melting point higher than the solder balls 15 in order to avoid unnecessary melting of the heat distributor 30 during the heating process.

Since the pins 36 of the heat distributor 30 may form a tight engagement with the contacts 12 of the connector 10, the distributor 30 and the connector 10 are thus securely attached to each other. By means of a flat surface of the top face 33 of the heat distributor 30, a vacuum suction device (not shown) may be applied to the top face 33 of the heat distributor 30 for handling the connector 10 securely attached to the heat distributor 30. In this respect, the heat distributor 30 also functions as a pick-and-place member for handling the connector 10 with for example an industrial robot (not shown).

Figure 9:
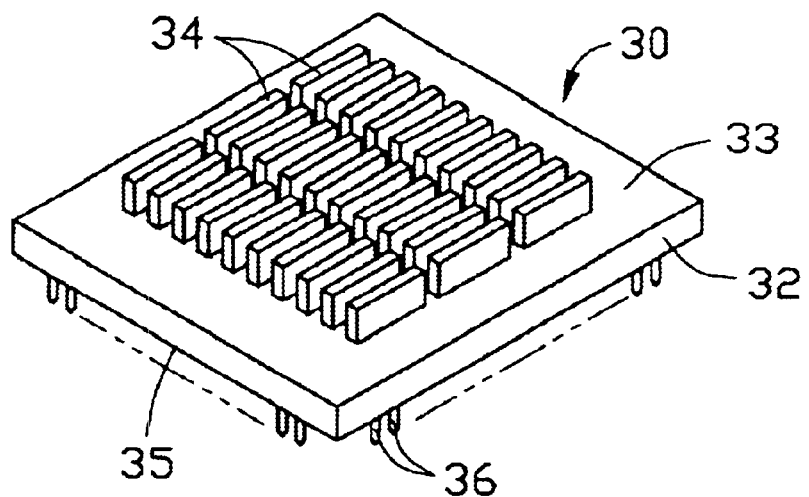
FIG. 9 is a perspective view of a heat distributor constructed in accordance with a second embodiment of the present invention.

To facilitate heat absorption and dissipation, the heat distributor 30 may be further provided with fins 34 extending from the top face 33 thereof. This is shown in FIG. 9 as a second embodiment of the present invention.

Figure 10:
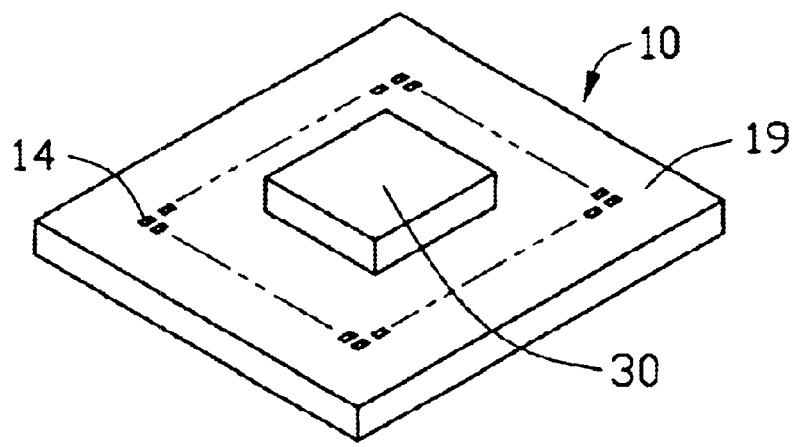
FIG. 10 is a perspective view of the heat distributor of the present invention in a different application.

It is apparent that the base plate 32 of the heat distributor 30 may have a surface area substantially corresponding to the top face 11 of the housing 19 of the connector 10 as shown in FIG. 5 or the surface area of the base plate 32 be substantially smaller than the top face of the connector 10 as shown in FIG. 10 wherein the heat distributor 30 is located at a central area of the top face 11 of the connector housing 19 for transferring heat to the solder balls 15 corresponding to the contacts located in the central area of the connector housing 19. Peripheral areas of the base plate 32 are removed.

Figure 11:
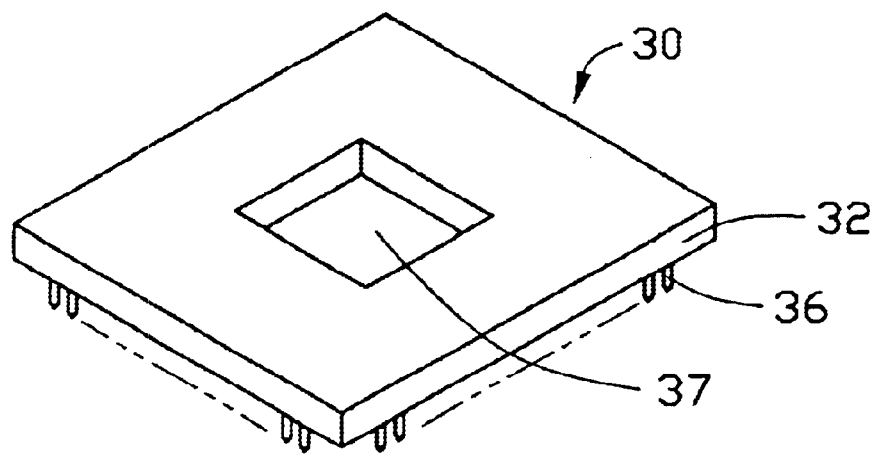
FIG. 11 is a perspective view of a heat distributor constructed in accordance with a third embodiment of the present invention.

Alternatively and as shown in FIG. 11 as a third embodiment of the present invention, a central opening 37 may be defined in the base plate 32 of the heat distributor 30. Such an opening 37 may be corresponding to a central opening of a connector, such as that shown in FIGS. 1 and 2.

Figure 12:
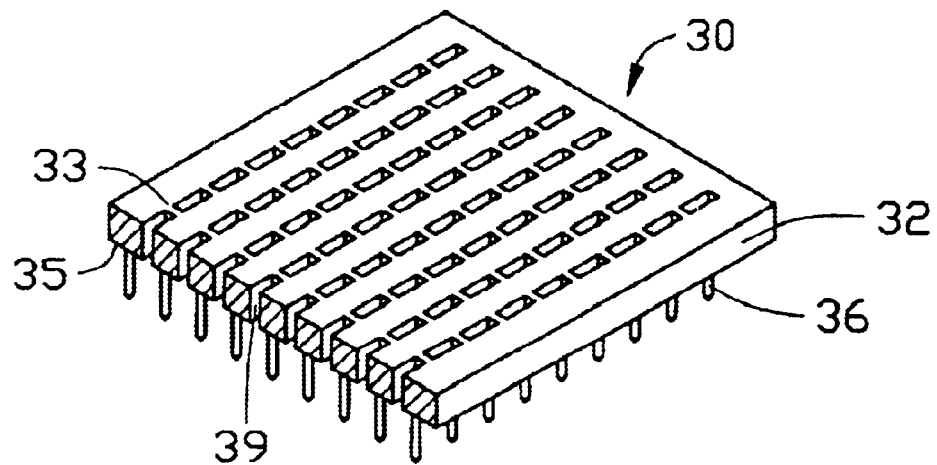

FIG. 12 shows a fourth embodiment of the heat distributor in accordance with the present invention wherein a number of apertures or slits 39 are defined in the base plate 32 between the pins 36. The purposes of the apertures or slits 39 is to reduce the overall mass of the heat distributor 30 whereby the heat kept in the heat distributor 30 can be reduced and heat transferred to the solder balls 15 can be maximized.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A heat distributor mounted to an electrical connector having an insulation housing defining cells with conductive contacts each carrying soldering material to be soldered to a circuit board for uniformly transferring heat to/from the contacts during a soldering process, the heat distributor comprising:

a base plate made of thermally conductive material, the base plate having a bottom face being directly positioned on the housing and an opposite top face; and a plurality of thermally conductive pins extending from the bottom face of the base plate;

wherein the pins are arranged in accordance with the cells and are inserted into the cells to physically engage the contacts for transferring heat to the contacts and the soldering material.

2. The heat distributor as claimed in claim 1, wherein the base plate and the pins are made of metals.

3. The heat distributor as claimed in claim 1, wherein the base plate has a surface area substantially corresponding to a top face of the connector housing.

4. The heat distributor as claimed in claim 1, wherein the base plate has a surface area substantially smaller than a top face of the connector housing.

5. The heat distributor as recited in claim 1, wherein the base plate defines a plurality of apertures for controlling heat absorbed thereby.

6. The heat distributor as recited in claim 1, further comprising a plurality of fins extending from the top face of the base plate.

7. An electrical connector system comprising:

a circuit board with conductive traces formed thereon;

an electrical connector comprising an insulation housing with a plurality of conductive members therein, the housing defining a top surface and a bottom surface and an array of cells between the top surface and the bottom surface, each cell with a conductive member therein, the conductive members each having tail sections corresponding to the conductive traces of the circuit board;

soldering pre-forms arranged between the conductive traces and the tail sections of the conductive members; and a heat distributor attached to the connector and comprising a base plate and conductive pins extending from the base plate toward the housing, the pins thermally engaging the conductive members of the connector and creating a homogenous heat transfer to/from the soldering pre-forms to thereby eliminate heat differences between the soldering pre-forms, the base plate defining a surface area no greater than the top surface of the connector housing, the heat distributor being centrally located on the top surface of the connector housing.

* * * * *